United States Patent
Park et al.

(10) Patent No.: US 9,944,802 B2
(45) Date of Patent: *Apr. 17, 2018

(54) COMPOSITION FOR FORMING SOLAR CELL ELECTRODE AND ELECTRODE PRODUCED FROM SAME

(71) Applicant: SAMSUNG SDI CO., LTD., Yongin-si, Gyeonggi-do (KR)

(72) Inventors: Sang Hee Park, Uiwang-si (KR); Hyun Jin Koo, Uiwang-si (KR); Tae Joon Kim, Uiwang-si (KR); Hun Gyu Song, Uiwang-si (KR)

(73) Assignee: SAMSUNG SDI CO., LTD., Yongin-si, Gyeonggi-Do (KR)

( * ) Notice: Subject to any disclaimer, the term of this patent is extended or adjusted under 35 U.S.C. 154(b) by 7 days.

This patent is subject to a terminal disclaimer.

(21) Appl. No.: 14/901,629

(22) PCT Filed: Jun. 27, 2014

(86) PCT No.: PCT/KR2014/005762
§ 371 (c)(1),
(2) Date: Dec. 28, 2015

(87) PCT Pub. No.: WO2015/030361
PCT Pub. Date: Mar. 5, 2015

(65) Prior Publication Data
US 2016/0304727 A1  Oct. 20, 2016

(30) Foreign Application Priority Data
Aug. 28, 2013  (KR) .................. 10-2013-0102759
Dec. 20, 2013  (KR) .................. 10-2013-0160769

(51) Int. Cl.
*C09D 5/24*  (2006.01)
*C03C 8/18*  (2006.01)
(Continued)

(52) U.S. Cl.
CPC .................. *C09D 5/24* (2013.01); *C03C 8/18* (2013.01); *C09D 1/00* (2013.01); *C09D 7/1216* (2013.01);
(Continued)

(58) Field of Classification Search
None
See application file for complete search history.

(56) References Cited

U.S. PATENT DOCUMENTS

2009/0189126 A1*  7/2009  Prunchak .................. C03C 8/02
                                                                  252/519.51
2011/0095240 A1*  4/2011  Nakamura .............. C03C 3/062
                                                                  252/514

FOREIGN PATENT DOCUMENTS

CN  101932535 A  12/2010
CN  102104076 A   6/2011
(Continued)

OTHER PUBLICATIONS

Shiomi, et al., "Effect of Addition of Ag on the Microstructures and Electrical Properties of Sol-Gel Derived SnO$_2$ Glass Composites" Journal of Materials Science: Materials in Electronics, 11, (2000) pp. 31-37.
(Continued)

*Primary Examiner* — Katie L Hammer
(74) *Attorney, Agent, or Firm* — Lee & Morse, P.C.

(57) ABSTRACT

The present invention relates to a composition for forming a solar cell electrode, comprising: silver (Ag) powder; a glass frit comprising silver (Ag) and tellurium (Te) elements; and an organic vehicle, wherein the glass frit has a mole ratio of 1:01 to 1:25 of Ag to Te. The solar cell electrode produced from the composition has excellent fill factor and conversion efficiency as contact resistance (Rc) and series resistance (Rs) are minimized.

9 Claims, 1 Drawing Sheet

(51) Int. Cl.
*C09D 1/00* (2006.01)
*C09D 7/12* (2006.01)
*H01L 31/0224* (2006.01)

(52) U.S. Cl.
CPC ...... *H01L 31/022425* (2013.01); *Y02E 10/50* (2013.01)

(56) References Cited

FOREIGN PATENT DOCUMENTS

| | | | |
|---|---|---|---|
| CN | 102956283 A | 3/2013 |
| CN | 102971268 A | 3/2013 |
| KR | 10-2010-0069699 A | 6/2010 |
| KR | 10-2010-0125273 A | 11/2010 |
| KR | 10-2012-0084045 A | 7/2012 |
| KR | 10-2013-0016344 A | 2/2013 |
| KR | 10-2013-0018344 A | 2/2013 |
| WO | WO 2011-046365 A2 | 4/2011 |

OTHER PUBLICATIONS

Korean Office Action dated Jun. 27, 2016 in Corresponding Korean Patent Application No. 10-2013-0160769.
Chinese Office action dated Nov. 4, 2016 for Chinese Patent Application No. 201480043119.5; Sang Hee Park, et al.
Korean Office action dated Dec. 2, 2015 for KR 10-2013-0160769; Sang Hee Park, et al.
Provisional double patenting rejection over claims of the above-identified application; USPTO Office action dated Apr. 21, 2017, in U.S. Appl. No. 14/655,985.

\* cited by examiner

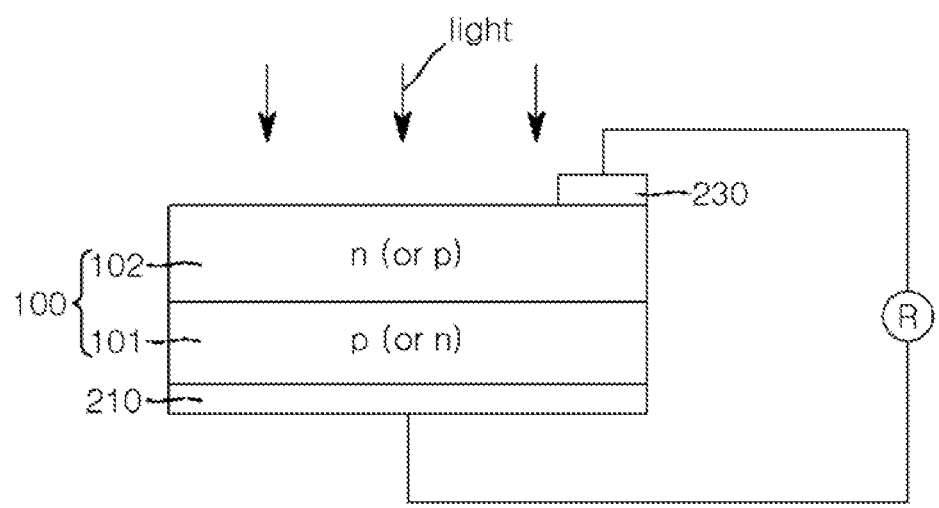

COMPOSITION FOR FORMING SOLAR CELL ELECTRODE AND ELECTRODE PRODUCED FROM SAME

CROSS REFERENCE TO RELATED APPLICATIONS

This is the U.S. national phase application based on PCT Application No. PCT/KR2014/005762, filed Jun. 27, 2014, which is based on Korean Patent Application Nos. 10-2013-0102759, filed Aug. 28, 2013, and 10-2013-0160769, filed Dec. 20, 2013, the entire contents of all of which are hereby incorporated by reference.

TECHNICAL FIELD

The present invention relates to a composition for solar cell electrodes and an electrode fabricated using the same.

BACKGROUND

Solar cells generate electricity using the photovoltaic effect of a pn junction which converts photons of sunlight into electricity. In the solar cell, front and rear electrodes are formed on upper and lower surfaces of a semiconductor wafer or substrate with the pn junctions, respectively. Then, the photovoltaic effect at the pn junction is induced by sunlight entering the semiconductor wafer and electrons generated by the photovoltaic effect at the pn junction provide electric current to the outside through the electrodes. The electrodes of the solar cell are formed on the wafer by applying, patterning, and baking an electrode composition.

Continuous reduction in emitter thickness to improve solar cell efficiency can cause shunting which can deteriorate solar cell performance. In addition, solar cells have been gradually increased in area to achieve higher efficiency. In this case, however, there can be a problem of efficiency deterioration due to increase in solar cell contact resistance.

Therefore, there is a need for a composition for solar cell electrodes that can enhance contact efficiency between electrodes and a silicon wafer to minimize contact resistance (Rc) and serial resistance (Rs), thereby providing excellent conversion efficiency.

DISCLOSURE

Technical Problem

One aspect of the present invention is to provide a composition for solar cell electrodes capable of enhancing contact efficiency between electrodes and a silicon wafer.

Another aspect of the present invention is to provide a composition for solar cell electrodes capable of minimizing contact resistance and serial resistance.

A further aspect of the present invention is to provide solar cell electrodes capable of providing excellent fill factor and conversion efficiency.

Yet another aspect of the present invention is to provide solar cell electrodes formed using the composition for solar cell electrodes.

The aspects of the present invention may be accomplished by the present invention described in the detailed description.

Technical Solution

The present invention relates to a composition for solar cell electrodes. In accordance with one aspect of the invention, a composition for solar cell electrodes may include a silver (Ag) powder; a glass frit containing elemental silver (Ag) and tellurium (Te); and an organic vehicle, wherein the glass frit has a mole ratio of Ag to Te ranging from about 1:0.1 to about 1:25.

The glass frit may further include at least one of lead (Pb), bismuth (Bi), phosphorus (P), germanium (Ge), gallium (Ga), antimony (Sb), cerium (Ce), iron (Fe), lithium (Li), silicon (Si), zinc (Zn), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), sodium (Na), potassium (K), arsenic (As), cobalt (Co), zirconium (Zr), manganese (Mn), neodymium (Nd), chromium (Cr), and aluminum (Al).

The elemental silver may originate from at least one of silver cyanide, silver nitrate, silver halide, silver carbonate, and silver acetate.

The glass frit may be formed of the silver compound and a metal oxide including tellurium (Te) oxide.

The metal oxide may further include at least one of lead (Pb) oxide, bismuth (Bi) oxide, phosphorus (P) oxide, germanium (Ge) oxide, gallium (Ga) oxide, antimony (Sb) oxide, cerium (Ce) oxide, iron (Fe) oxide, lithium (Li) oxide, silicon (Si) oxide, zinc (Zn) oxide, tungsten (W) oxide, magnesium (Mg) oxide, cesium (Cs) oxide, strontium (Sr) oxide, molybdenum (Mo) oxide, titanium (Ti) oxide, tin (Sn) oxide, indium (In) oxide, vanadium (V) oxide, ruthenium (Ru) oxide, barium (Ba) oxide, nickel (Ni) oxide, copper (Cu) oxide, sodium (Na) oxide, potassium (K) oxide, arsenic (As) oxide, cobalt (Co) oxide, zirconium (Zr) oxide, manganese (Mn) oxide, neodymium (Nd) oxide, chromium (Cr) oxide, and aluminum (Al) oxide.

The composition may include about 60 wt % to about 95 wt % of the silver powder; about 0.1 wt % to about 20 wt % of the glass frit; and about 1 wt % to about 30 wt % of the organic vehicle.

The glass frit may contain about 0.1 mol % to about 50 mol % of the elemental silver (Ag) based on the total moles of the glass frit.

The glass frit may have an average particle diameter (D50) of about 0.1 μm to about 10 μm.

The composition may further include at least one of a dispersant, a thixotropic agent, a plasticizer, a viscosity stabilizer, an anti-foaming agent, a pigment, a UV stabilizer, an antioxidant, and a coupling agent.

In accordance with another aspect of the invention, a solar cell electrode formed of the composition for solar cell electrodes is provided.

Advantageous Effects

The present invention provides a composition for solar cell electrodes, enhancing contact efficiency between electrodes and a silicon wafer by introducing a silver compound having a decomposition temperature of about 1000° C. or less, at which the silver compound is decomposed into ions, into a glass frit. Thus, solar cell electrodes produced from the composition have minimized contact resistance (Rc) and serial resistance (Rs), thereby providing excellent fill factor and conversion efficiency

DESCRIPTION OF DRAWINGS

FIG. 1 is a schematic view of a solar cell in accordance with one embodiment of the present invention.

BEST MODE

Composition for Solar Cell Electrodes

A composition for solar cell electrodes according to the present invention includes a silver (Ag) powder; a glass frit containing elemental silver (Ag) and tellurium (Te); and an organic vehicle, wherein the glass frit may have a mole ratio of Ag to Te ranging from about 1:0.1 to about 1:25. Now, each component of the composition for solar cell electrodes according to the present invention will be described in more detail.

(A) Silver Powder

The composition for solar cell electrodes according to the invention includes a silver (Ag) powder as a conductive powder. The particle size of the silver powder may be on a nanometer or micrometer scale. For example, the silver (Ag) powder may have a particle size of dozens to several hundred nanometers, or several to dozens of micrometers. In one embodiment, the silver powder may be a mixture of two or more types of silver powders having different particle sizes.

The silver powder may have a spherical, flake or amorphous shape.

The silver powder preferably has an average particle diameter (D50) of about 0.1 μm to about 10 μm, more preferably about 0.5 μm to about 5 μm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition can provide low contact resistance and low line resistance.

The silver powder may be present in an amount of about 60 wt % to about 95 wt % based on the total weight of the composition. Within this range, the conductive powder may prevent deterioration in conversion efficiency which may otherwise occur due to an increase in resistance and may prevent difficulty in forming the paste due to relative reduction in amount of the organic vehicle. Preferably, the conductive powder may be present in an amount of about 70 wt % to about 90 wt %, for example, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, or 90 wt %.

(B) Glass Frit

The glass fit may help to enhance adhesion between the conductive powder and the wafer or the substrate and to form silver crystal grains in an emitter region by etching an anti-reflection layer and melting the silver powder so as to reduce contact resistance during the baking process of the composition for electrodes. Further, during the baking process, the glass frit may soften and decrease the baking temperature.

When the area of the solar cell is increased in order to improve solar cell efficiency, solar cell contact resistance may increase. Thus, both serial resistance and influence on the pn junction may be minimized. In addition, as the baking temperatures may vary within a broad range with increasing use of various wafers having different sheet resistances, it may be desirable for the glass frit to secure sufficient thermal stability to withstand a wide range of baking temperatures.

The glass frit may be formed of a silver (Ag) compound and a metal oxide. Specifically, the glass frit may be prepared by mixing, melting, and pulverizing a silver compound having a decomposition temperature of about 1000° C. or less at which the silver compound is decomposed into Ag ions, and a metal oxide. The metal oxide may include at least one kind of metal oxide.

The silver compound is an ionic compound and may include silver cyanide (AgCN), silver nitrate ($AgNO_3$), silver halide (Ag—X), silver carbonate ($Ag_2CO_3$), silver acetate ($AgC_2H_3O_2$), and mixtures thereof. In the silver halide, X may be iodine, fluorine, chlorine, or bromine, and is preferably iodine.

In one embodiment, the metal oxide includes tellurium (Te) oxide and, in addition to the tellurium (Te) oxide, may further include at least one of lead (Pb) oxide, bismuth (Bi) oxide, phosphorus (P) oxide, germanium (Ge) oxide, gallium (Ga) oxide, antimony (Sb) oxide, cerium (Ce) oxide, iron (Fe) oxide, lithium (Li) oxide, silicon (Si) oxide, zinc (Zn) oxide, tungsten (W) oxide, magnesium (Mg) oxide, cesium (Cs) oxide, strontium (Sr) oxide, molybdenum (Mo) oxide, titanium (Ti) oxide, tin (Sn) oxide, indium (In) oxide, vanadium (V) oxide, ruthenium (Ru) oxide, barium (Ba) oxide, nickel (Ni) oxide, copper (Cu) oxide, sodium (Na) oxide, potassium (K) oxide, arsenic (As) oxide, cobalt (Co) oxide, zirconium (Zr) oxide, manganese (Mn) oxide, neodymium (Nd) oxide, chromium (Cr) oxide, and aluminum (Al) oxide.

The glass frit formed of the silver compound and the metal oxide according to the invention may include elemental silver (Ag) and tellurium (Te), and have a mole ratio of Ag to Te in the glass frit ranging from about 1:0.1 to about 1:25. Within this range, it is possible to ensure low serial resistance and contact resistance. In one embodiment, the glass frit may have a mole ratio of Ag to Te in the glass frit ranging from 1:0.3 to 1:24, for example, from 1:1 to 1:21. The term mole ratio, as used herein, means a mole ratio of each element.

By way of another example, the glass frit may further include at least one of lead (Pb), bismuth (Bi), phosphorus (P), germanium (Ge), gallium (Ga), antimony (Sb), cerium (Ce), iron (Fe), lithium (Li), silicon (Si), zinc (Zn), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), sodium (Na), potassium (K), arsenic (As), cobalt (Co), zirconium (Zr), manganese (Mn), neodymium (Nd), chromium (Cr), and aluminum (Al).

Furthermore, the glass frit may contain about 0.1 mol % to about 50 mol % of elemental silver (Ag), preferably about 0.5 mol % to about 40 mol % of elemental silver, based on the total moles of the glass frit.

The content of each elemental metal contained in the glass frit may be measured by Inductively Coupled Plasma-Optical Emission Spectroscopy (ICP-OES). ICP-OES requires very small sample amounts, and thus can shorten sample set-up time and reduce an error due to pre-treatment of the sample while providing excellent analytical sensitivity.

Specifically, ICP-OES may include pre-treating a sample, preparing a standard solution, and calculating the content of each element in a glass frit by measuring and converting the concentrations of target elements, thereby enabling accurate measurement of the content of each element in the glass frit.

In operation of pre-treating a sample, a predetermined amount of the sample may be dissolved in an acid solution capable of dissolving a sample glass frit, and then heated for carbonization. The acid solution may include, for example, a sulfuric acid ($H_2SO_4$) solution.

The carbonized sample may be diluted with a solvent, such as distilled water or hydrogen peroxide ($H_2O_2$), to an appropriate extent that allows analysis of an element to be performed. In view of element detection capability of an ICP-OES tester, the carbonized sample may be diluted about 10,000 times.

In measurement with the ICP-OES tester, the pre-treated sample may be calibrated using a standard solution, such as a solution of an element to be analyzed.

By way of example, calculation of the mole ratio of each element in the glass frit can be accomplished by introducing the standard solution into the ICP-OES tester and plotting a calibration curve with an external standard method, followed by measuring and converting the concentration (ppm) of the element to be analyzed in the pre-treated sample using the ICP-OES tester.

The glass frit may be prepared from the silver compound and the metal oxide, as described above, by any typical method known in the art. For example, the silver compound and the metal oxide may be mixed in a predetermined ratio. Mixing may be carried out using a ball mill or a planetary mill. The mixture is melted at about 800° C. to about 1300° C., followed by quenching to 25° C. The obtained resultant is subjected to pulverization using a disc mill, a planetary mill, or the like, thereby preparing a glass frit.

The glass frit may have an average particle diameter (D50) of about 0.1 μm to about 10 μm, and may have a spherical or amorphous shape.

The glass frit may be present in an amount of about 0.1 wt % to about 20 wt %, preferably about 0.5 wt % to about 10 wt %, for example, 1 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 8 wt %, 9 wt %, or 10 wt %, based on the total weight of the composition. Within this range, it is possible to secure pn junction stability given varying surface resistances while minimizing serial resistance so as to improve solar cell efficiency.

(C) Organic Vehicle

The organic vehicle may impart suitable viscosity and rheological characteristics for printing to the composition for solar cell electrodes through mechanical mixing with the inorganic component of the composition.

The organic vehicle may include a suitable organic vehicle for solar cell electrode compositions, i.e., a binder resin, a solvent, and the like.

The binder resin may be selected from acrylate resins or cellulose resins. In one embodiment, ethylcellulose may be used as the binder resin. In another embodiment, the binder resin may be selected from among ethyl hydroxyethylcellulose, nitrocellulose, blends of ethylcellulose and phenol resins, alkyd resins, phenol resins, acrylate ester resins, xylene resins, polybutene resins, polyester resins, urea resins, melamine resins, vinyl acetate resins, wood rosin, polymethacrylates of alcohols, and the like.

The solvent may be selected from the group consisting of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, and combinations thereof.

The organic vehicle may be present in an amount of about 1 wt % to about 30 wt % based on the total weight of the composition. Within this range, the organic vehicle can provide sufficient adhesive strength and excellent printability to the composition.

(D) Additives

The composition for solar cell electrodes according to the invention may further include typical additives to enhance flow and process properties and stability as needed. The additives may include dispersants, thixotropic agents, plasticizers, viscosity stabilizers, anti-foaming agents, pigments, UV stabilizers, antioxidants, coupling agents, and the like, without being limited thereto. These additives may be used alone or as mixtures thereof. These additives may be present in the composition in an amount of about 0.1 wt % to about 5 wt %, without being limited thereto.

Solar Cell Electrode and Solar Cell Including the Same

Other aspects of the invention relate to an electrode formed of the composition for solar cell electrodes and a solar cell including the same. FIG. 1 shows a solar cell in accordance with one embodiment of the invention.

Referring to FIG. 1, a rear electrode 210 and a front electrode 230 may be formed by printing and baking the composition on a wafer or substrate 100 that includes a p layer (or n layer) 101 and an n layer (or p layer) 102, which serve as an emitter. For example, a preliminary process of preparing the rear electrode 210 is performed by printing the composition on the rear surface of the wafer 100 and drying the printed composition at about 200° C. to about 400° C. for about 10 to about 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., preferably at 700° C. to about 950° C., for about 30 to about 210 seconds.

MODE FOR INVENTION

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES 1 TO 93 AND COMPARATIVE EXAMPLES 1 AND 2

Example 1

As an organic binder, 3.0 wt % of ethylcellulose (ETHOCEL STD4, Dow Chemical Company) was sufficiently dissolved in 6.5 wt % of butyl carbitol at 60° C., and 86.90 wt % of spherical silver powder (AG-4-8, Dowa Hightech Co., Ltd.) having an average particle diameter of 2.0 μm, 3.1 wt % of glass frits including silver cyanide (AgCN) as a silver compound and prepared according to the composition as listed in Table 1, 0.2 wt % of a dispersant DISPER BYK102 (BYK-Chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

Examples 2 to 18

Compositions for solar cell electrodes were prepared in the same manner as in Example 1 except that the glass frits were prepared according to the compositions as listed in Table 1.

Examples 19 to 36

Compositions for solar cell electrodes were prepared in the same manner as in Example 1 except that glass frits containing silver nitrate ($AgNO_3$) as a silver compound were prepared according to the compositions as listed in Table 2.

Examples 37 to 54

Compositions for solar cell electrodes were prepared in the same manner as in Example 1 except that glass frits containing silver iodide (AgI) as a silver compound were prepared according to the compositions as listed in Table 3.

Examples 55 to 72

Compositions for solar cell electrodes were prepared in the same manner as in Example 1 except that glass frits containing silver carbonate ($Ag_2CO_3$) as a silver compound were prepared according to the compositions as listed in Table 4.

Examples 73 to 93

Compositions for solar cell electrodes were prepared in the same manner as in Example 1 except that glass frits containing silver acetate ($Ag_2C_2H_3O_2$) as a silver compound were prepared according to the compositions as listed in Table 5.

Comparative Examples 1 to 2

Compositions for solar cell electrodes were prepared in the same manner as in Example 1 except that the glass frits were prepared according to the compositions as listed in Table 6.

Measurement of Mole Ratio of Ag:Te in Glass Frit Using Inductively Coupled Plasma-Optical Emission Spectroscopy (ICP-OES)

Pretreatment of Samples:

0.5 g of a glass frit sample to be analyzed was placed in a beaker and weighed to an accuracy of 0.0001 g. 5 ml of sulfuric acid ($H_2SO_4$) was added to the beaker, followed by heating at 220° C. for 3 hours using a hot plate until the sample was completely carbonized. Hydrogen peroxide ($H_2O_2$) was added to the beaker until the beaker containing the carbonized sample became transparent, thereby completing pretreatment.

Preparation of Standard Solution:

Standard solutions of elemental silver (Ag) and elemental tellurium (Te) were prepared.

Measurement of Mole Ratio of Ag:Te:

Nitric acid ($HNO_3$) was added to the beaker containing the pre-treated sample, followed by heating for 5 minutes and air-cooling. The prepared standard solution was introduced into an ICP-OES tester (PerkinElmer, Inc.) and a calibration curve was plotted by an external standard method, followed by measuring and converting the concentration (ppm) of the elemental silver (Ag) and tellurium (Te) in the sample using the ICP-OES tester, thereby calculating the mole ratio of Ag:Te in the glass frit. Results are shown in Table 7.

Content of each element (%)=Concentration of each element (ppm)×Dilution Factor (DF)/10000

Mole of each element=Content of each element/Molecular weight of each element

Mole ratio of Ag:Te=1:(Mole of Te/Mole of Ag)

TABLE 1

| | Composition of glass frit (unit: wt %) | | | | | | | | | | | | | |
|---|---|---|---|---|---|---|---|---|---|---|---|---|---|---|
| | AgCN | PbO | $Bi_2O_3$ | $TeO_2$ | $P_2O_5$ | $Li_2CO_3$ | $SiO_2$ | ZnO | $WO_3$ | $Nd_2O_3$ | MgO | $Na_2CO_3$ | $Sb_2O_3$ | $Cr_2O_3$ |
| Example 1 | 5 | — | 40 | 42 | — | 2 | 3 | 5 | — | — | — | 3 | — | — |
| Example 2 | 15 | — | 30 | 42 | — | 2 | 3 | 5 | 3 | — | — | — | — | — |
| Example 3 | 30 | — | 20 | 32 | — | 2 | 8 | 5 | — | 3 | — | — | — | — |
| Example 4 | 5 | 40 | — | 50 | — | 2 | 3 | — | — | — | — | — | — | — |
| Example 5 | 15 | 30 | — | 50 | — | 2 | 3 | — | — | — | — | — | — | — |
| Example 6 | 30 | 20 | — | 40 | — | 2 | 8 | — | — | — | — | — | — | — |
| Example 7 | 5 | — | 40 | 40 | 10 | 2 | 3 | — | — | — | — | — | — | — |
| Example 8 | 15 | — | 30 | 45 | — | 2 | 3 | 5 | — | — | — | — | — | — |
| Example 9 | 30 | — | 20 | 38 | — | 2 | 8 | — | — | — | 2 | — | — | — |
| Example 10 | 5 | 40 | — | 47 | — | 2 | 3 | — | — | 3 | — | — | — | — |
| Example 11 | 15 | 35 | — | 34 | — | 2 | 3 | 11 | — | — | — | — | — | — |
| Example 12 | 30 | 30 | — | 27 | — | 2 | 8 | — | 3 | — | — | — | — | — |
| Example 13 | 5 | — | 40 | 47 | — | 2 | 3 | — | — | — | — | 3 | — | — |
| Example 14 | 15 | — | 35 | 42 | — | 2 | 3 | — | — | — | — | 3 | — | — |
| Example 15 | 30 | — | 20 | 37 | — | 2 | 8 | — | — | — | — | 3 | — | — |
| Example 16 | 5 | 40 | — | 41 | — | 2 | 3 | 7 | — | 2 | — | — | — | — |
| Example 17 | 15 | 35 | — | 33 | — | 2 | 3 | 7 | — | 3 | 2 | — | — | — |
| Example 18 | 30 | 20 | — | 29 | — | 3 | 8 | 7 | — | 3 | — | — | — | — |

TABLE 2

| | Composition of glass frit (unit: wt %) | | | | | | | | | | | | | |
|---|---|---|---|---|---|---|---|---|---|---|---|---|---|---|
| | $AgNO_3$ | PbO | $Bi_2O_3$ | $TeO_2$ | $P_2O_5$ | $Li_2CO_3$ | $SiO_2$ | ZnO | $WO_3$ | $Nd_2O_3$ | MgO | $Na_2CO_3$ | $Sb_2O_3$ | $Cr_2O_3$ |
| Example 19 | 5 | — | — | 50 | — | 2 | 3 | 16 | — | — | 8 | — | 7 | 9 |
| Example 20 | 15 | — | — | 45 | — | 2 | 3 | 17 | 6 | 5 | 2 | 5 | — | — |
| Example 21 | 30 | — | — | 30 | — | 2 | 8 | 25 | — | 2 | — | 3 | — | — |
| Example 22 | 5 | — | 40 | 50 | — | 2 | 2 | — | 1 | — | — | — | — | — |
| Example 23 | 15 | — | 35 | 42 | — | 5 | 2 | — | — | — | 1 | — | — | — |
| Example 24 | 30 | — | 20 | 40 | — | 2 | 5 | — | — | 3 | — | — | — | — |

TABLE 2-continued

| | Composition of glass frit (unit: wt %) | | | | | | | | | | | | | |
|---|---|---|---|---|---|---|---|---|---|---|---|---|---|---|
| | AgNO$_3$ | PbO | Bi$_2$O$_3$ | TeO$_2$ | P$_2$O$_5$ | Li$_2$CO$_3$ | SiO$_2$ | ZnO | WO$_3$ | Nd$_2$O$_3$ | MgO | Na$_2$CO$_3$ | Sb$_2$O$_3$ | Cr$_2$O$_3$ |
| Example 25 | 5 | 40 | 19 | 21 | 6 | 2 | 2 | — | — | — | — | — | — | 5 |
| Example 26 | 15 | 35 | 29 | 10 | 5 | 2 | 2 | — | — | — | — | — | — | 2 |
| Example 27 | 30 | 30 | 19 | 9 | 2 | 2 | 5 | — | — | — | — | — | — | 3 |
| Example 28 | 5 | 40 | 23 | 17 | — | 2 | 2 | — | — | — | — | — | 11 | — |
| Example 29 | 15 | 27 | 17 | 21 | — | 2 | 2 | — | — | — | — | — | 16 | — |
| Example 30 | 30 | 28 | 12 | 10 | — | 2 | 5 | — | — | — | — | — | 13 | — |
| Example 31 | 5 | — | 40 | 42 | — | 2 | 3 | 5 | — | — | — | 3 | — | — |
| Example 32 | 15 | — | 30 | 42 | — | 2 | 3 | 5 | 3 | — | — | — | — | — |
| Example 33 | 30 | — | 20 | 32 | — | 2 | 8 | 5 | — | 3 | — | — | — | — |
| Example 34 | 3 | 40 | — | 53 | — | 2 | 2 | — | — | — | — | — | — | — |
| Example 35 | 15 | 35 | — | 45 | — | 2 | 3 | — | — | — | — | — | — | — |
| Example 36 | 30 | 20 | — | 40 | — | 2 | 8 | — | — | — | — | — | — | — |

TABLE 3

| | Composition of glass frit (unit: wt %) | | | | | | | | | | | | | |
|---|---|---|---|---|---|---|---|---|---|---|---|---|---|---|
| | AgI | PbO | Bi$_2$O$_3$ | TeO$_2$ | P$_2$O$_5$ | Li$_2$CO$_3$ | SiO$_2$ | ZnO | WO$_3$ | Nd$_2$O$_3$ | MgO | Na$_2$CO$_3$ | Sb$_2$O$_3$ | Cr$_2$O$_3$ |
| Example 37 | 5 | — | 40 | 50 | — | 2 | 3 | — | — | — | — | — | — | — |
| Example 38 | 15 | — | 32 | 48 | — | 2 | 3 | — | — | — | — | — | — | — |
| Example 39 | 30 | — | 30 | 30 | — | 2 | 8 | — | — | — | — | — | — | — |
| Example 40 | 5 | 40 | — | 42 | — | 2 | 3 | 5 | — | — | — | 3 | — | — |
| Example 41 | 15 | 35 | — | 37 | — | 2 | 3 | 5 | 3 | — | — | — | — | — |
| Example 42 | 30 | 30 | — | 22 | — | 2 | 8 | 5 | — | 3 | — | — | — | — |
| Example 43 | 5 | — | 40 | 36 | — | 2 | 3 | 9 | — | 2 | 3 | — | — | — |
| Example 44 | 15 | — | 35 | 34 | — | 2 | 3 | 8 | — | 3 | — | — | — | — |
| Example 45 | 30 | — | 20 | 27 | — | 2 | 8 | 13 | — | — | — | — | — | — |
| Example 46 | 5 | 40 | — | 39 | — | 2 | 3 | 11 | — | — | — | — | — | — |
| Example 47 | 15 | 35 | — | 37 | — | 2 | 3 | 8 | — | — | — | — | — | — |
| Example 48 | 30 | 30 | — | 21 | — | 2 | 8 | 9 | — | — | — | — | — | — |
| Example 49 | 5 | — | 40 | 45 | — | 2 | — | 5 | — | — | — | 3 | — | — |
| Example 50 | 15 | — | 35 | 37 | — | 2 | 3 | 5 | 3 | — | — | — | — | — |
| Example 51 | 30 | — | 20 | 32 | — | 2 | 8 | 5 | — | 3 | — | — | — | — |
| Example 52 | 4 | 37 | — | 54 | — | 2 | 3 | — | — | — | — | — | — | — |
| Example 53 | 15 | 35 | — | 45 | — | 2 | 3 | — | — | — | — | — | — | — |
| Example 54 | 30 | 20 | — | 40 | — | 2 | 8 | — | — | — | — | — | — | — |

TABLE 4

| | Composition of glass frit (unit: wt %) | | | | | | | | | | | | | |
|---|---|---|---|---|---|---|---|---|---|---|---|---|---|---|
| | Ag$_2$CO$_3$ | PbO | Bi$_2$O$_3$ | TeO$_2$ | P$_2$O$_5$ | Li$_2$CO$_3$ | SiO$_2$ | ZnO | WO$_3$ | Nd$_2$O$_3$ | MgO | Na$_2$CO$_3$ | Sb$_2$O$_3$ | Cr$_2$O$_3$ |
| Example 55 | 5 | — | — | 50 | — | 2 | 3 | 17 | — | 5 | 3 | 5 | — | 10 |
| Example 56 | 15 | — | — | 45 | — | 2 | 3 | 18 | 7 | — | — | — | — | 10 |
| Example 57 | 30 | — | — | 30 | — | 2 | 8 | 12 | 10 | 3 | 5 | — | — | — |
| Example 58 | 5 | — | 40 | 50 | — | 2 | 2 | — | 1 | — | — | — | — | — |
| Example 59 | 15 | — | 35 | 45 | — | 2 | 2 | — | — | — | 1 | — | — | — |
| Example 60 | 30 | — | 30 | 30 | — | 2 | 5 | — | — | 3 | — | — | — | — |
| Example 61 | 5 | 40 | — | 50 | — | 2 | 3 | — | — | — | — | — | — | — |
| Example 62 | 15 | 35 | — | 45 | — | 2 | 3 | — | — | — | — | — | — | — |
| Example 63 | 30 | 20 | — | 40 | — | 2 | 8 | — | — | — | — | — | — | — |
| Example 64 | 5 | — | — | 50 | — | 2 | 3 | 19 | — | 5 | 3 | — | 10 | 3 |
| Example 65 | 15 | — | — | 45 | — | 2 | 3 | 21 | — | 5 | 4 | — | — | 5 |
| Example 66 | 30 | — | — | 32 | — | 2 | 8 | 15 | 3 | 3 | 5 | 2 | — | — |
| Example 67 | 5 | — | 40 | 50 | — | 2 | 2 | — | 1 | — | — | — | — | — |
| Example 68 | 15 | — | 35 | 45 | — | 2 | 2 | — | — | — | 1 | — | — | — |
| Example 69 | 30 | — | 20 | 40 | — | 2 | 5 | — | — | 3 | — | — | — | — |
| Example 70 | 5 | 40 | — | 40 | — | 2 | 2 | — | — | — | — | — | — | 11 |
| Example 71 | 15 | 30 | — | 35 | — | 2 | 2 | — | — | — | — | — | — | 16 |
| Example 72 | 30 | 20 | — | 30 | — | 2 | 5 | — | — | — | — | — | — | 13 |

TABLE 5

Composition of glass frit (unit: wt %)

| | AgC$_2$H$_3$O$_2$ | PbO | Bi$_2$O$_3$ | TeO$_2$ | P$_2$O$_5$ | Li$_2$CO$_3$ | SiO$_2$ | ZnO | WO$_3$ | Nd$_2$O$_3$ | MgO | Na$_2$CO$_3$ | Sb$_2$O$_3$ | Cr$_2$O$_3$ |
|---|---|---|---|---|---|---|---|---|---|---|---|---|---|---|
| Example 73 | 5 | 40 | — | 40 | — | 2 | 2 | — | — | — | — | — | 11 | — |
| Example 74 | 15 | 30 | — | 35 | — | 2 | 2 | — | — | — | — | — | 16 | — |
| Example 75 | 30 | 25 | — | 25 | — | 2 | 5 | — | — | — | — | — | 13 | — |
| Example 76 | 5 | 40 | — | 40 | — | 2 | 2 | — | — | — | — | — | — | 11 |
| Example 77 | 15 | 35 | — | 30 | — | 2 | 2 | — | — | — | — | — | — | 16 |
| Example 78 | 30 | 25 | — | 25 | — | 2 | 5 | — | — | — | — | — | — | 13 |
| Example 79 | 10 | 35 | — | 28 | — | 2 | 2 | 7 | — | 5 | — | — | 11 | — |
| Example 80 | 20 | 25 | — | 24 | — | 2 | 2 | 9 | — | 2 | — | — | 16 | — |
| Example 81 | 30 | 26 | — | 32 | — | 2 | 2 | 2 | — | 3 | — | — | 3 | — |
| Example 82 | 5 | — | 40 | 50 | — | 2 | — | 3 | — | — | — | — | — | — |
| Example 83 | 15 | — | 35 | 45 | — | 2 | — | 3 | — | — | — | — | — | — |
| Example 84 | 30 | — | 20 | 40 | — | 2 | — | 8 | — | — | — | — | — | — |
| Example 85 | 5 | — | 40 | 50 | — | 2 | — | — | 1 | — | — | — | — | 2 |
| Example 86 | 15 | — | 30 | 50 | — | 2 | — | — | — | — | 1 | — | 2 | — |
| Example 87 | 30 | — | 25 | 35 | — | 2 | — | — | — | 3 | — | — | — | 5 |
| Example 88 | 5 | — | 40 | 50 | — | 2 | — | 3 | — | — | — | — | — | — |
| Example 89 | 15 | — | 35 | 45 | — | 2 | — | 3 | — | — | — | — | — | — |
| Example 90 | 30 | — | 20 | 40 | — | 2 | — | 8 | — | — | — | — | — | — |
| Example 91 | 5 | — | 40 | 50 | — | 2 | — | — | 1 | — | — | — | — | 2 |
| Example 92 | 15 | — | 33 | 47 | — | 2 | — | — | — | — | 1 | — | 2 | — |
| Example 93 | 30 | — | 27 | 33 | — | 2 | — | — | — | 3 | — | — | — | 5 |

TABLE 6

Composition of glass frit (unit: wt %)

| | Ag$_2$CO$_3$ | PbO | Bi$_2$O$_3$ | TeO$_2$ | P$_2$O$_5$ | Li$_2$CO$_3$ | SiO$_2$ | ZnO | WO$_3$ | Nd$_2$O$_3$ | MgO | Na$_2$CO$_3$ | Sb$_2$O$_3$ | Cr$_2$O$_3$ |
|---|---|---|---|---|---|---|---|---|---|---|---|---|---|---|
| Comparative Example 1 | 0.1 | — | 39.9 | 50 | — | 2 | 5 | — | — | 3 | — | — | — | — |
| Comparative Example 2 | — | — | 25 | 35 | — | 2 | 8 | 15 | 7 | 5 | 3 | — | — | — |

TABLE 7

| | Mole ratio (Ag:Te) | | Mole ratio (Ag:Te) | | Mole ratio (Ag:Te) | | Mole ratio (Ag:Te) |
|---|---|---|---|---|---|---|---|
| Example 1 | 1:8.24 | Example 22 | 1:12.52 | Example 49 | 1:15.85 | Example 61 | 1:20.91 |
| Example 2 | 1:3.19 | Example 23 | 1:3.41 | Example 50 | 1:4.15 | Example 62 | 1:6.74 |
| Example 3 | 1:1.22 | Example 24 | 1:2.11 | Example 51 | 1:2.21 | Example 63 | 1:2.65 |
| Example 4 | 1:9.80 | Example 25 | 1:5.21 | Example 52 | 1:23.21 | Example 64 | 1:20.24 |
| Example 5 | 1:3.57 | Example 26 | 1:0.88 | Example 53 | 1:5.59 | Example 65 | 1:6.87 |
| Example 6 | 1:1.41 | Example 27 | 1:0.43 | Example 54 | 1:2.67 | Example 66 | 1:2.59 |
| Comparative Example 1 | 1:1,021 | | | | | | |

Measurement of Contact Resistance

The compositions prepared in the examples and comparative examples were deposited onto a front surface of a crystalline mono-wafer by screen-printing in a predetermined pattern, followed by drying in an IR drying furnace. Cells formed according to this procedure were subjected to baking at 700° C. to 950° C. for 30 to 210 seconds in a belt-type baking furnace, and then evaluated for contact resistance (Rc) using a TLM (Transfer Length Method) tester. The measured results are shown in Table 8 to 13.

Measurement of Serial Resistance, Fill Factor, and Conversion Efficiency

The compositions prepared in the examples and comparative examples were deposited over a front surface of a crystalline mono-wafer by screen-printing in a predetermined pattern, followed by drying in an IR drying furnace. Then, the aluminum paste was printed on a rear side of the wafer and dried in the same manner as above. Cells formed according to this procedure were subjected to baking at 700° C. to 950° C. for 30 to 210 seconds in a belt-type baking furnace, and evaluated for serial resistance (Rs), fill factor (FF, %), and conversion efficiency (%) using a solar cell efficiency tester CT-801 (Pasan Co., Ltd.). The measured serial resistance, fill factor, and conversion efficiency are shown in Table 8 to 13.

TABLE 8

| | Contact Resistance (mΩ) | Serial Resistance (mΩ) | Fill Factor | Efficiency (%) |
|---|---|---|---|---|
| Example 1 | 0.5483 | 5.3431 | 76.2713 | 16.5189 |
| Example 2 | 0.4600 | 5.0981 | 76.6767 | 16.7327 |
| Example 3 | 0.3932 | 4.8709 | 76.9111 | 16.9645 |
| Example 4 | 0.5776 | 5.4412 | 76.0439 | 16.3649 |
| Example 5 | 0.4730 | 5.1457 | 76.5818 | 16.6631 |
| Example 6 | 0.3982 | 4.9151 | 76.9037 | 16.9372 |
| Example 7 | 0.5633 | 5.4111 | 76.1731 | 16.4249 |
| Example 8 | 0.4449 | 5.0273 | 76.7584 | 16.7818 |

TABLE 8-continued

|  | Contact Resistance (mΩ) | Serial Resistance (mΩ) | Fill Factor | Efficiency (%) |
|---|---|---|---|---|
| Example 9 | 0.3685 | 4.7614 | 77.1490 | 17.1143 |
| Example 10 | 0.5373 | 5.3216 | 76.3318 | 16.5409 |
| Example 11 | 0.4618 | 5.1093 | 76.6648 | 16.7182 |
| Example 12 | 0.4146 | 4.9428 | 76.8997 | 16.8649 |
| Example 13 | 0.5184 | 5.2750 | 76.3996 | 16.5823 |
| Example 14 | 0.5002 | 5.2421 | 76.4913 | 16.6248 |
| Example 15 | 0.3793 | 4.8165 | 76.9524 | 17.0102 |
| Example 16 | 0.5857 | 5.4850 | 75.9970 | 16.3069 |
| Example 17 | 0.4932 | 5.1895 | 76.5039 | 16.6443 |
| Example 18 | 0.3692 | 4.7727 | 77.1006 | 17.0626 |

TABLE 9

|  | Contact Resistance (mΩ) | Serial Resistance (mΩ) | Fill Factor | Efficiency (%) |
|---|---|---|---|---|
| Example 19 | 0.5624 | 5.4051 | 76.2260 | 16.4506 |
| Example 20 | 0.4965 | 5.2305 | 76.4992 | 16.6425 |
| Example 21 | 0.3951 | 4.8825 | 76.9108 | 16.9638 |
| Example 22 | 0.5310 | 5.3189 | 76.3521 | 16.5533 |
| Example 23 | 0.4688 | 5.1341 | 76.6324 | 16.6862 |
| Example 24 | 0.3299 | 4.4368 | 77.7740 | 17.8419 |
| Example 25 | 0.5624 | 5.4051 | 76.2260 | 16.4506 |
| Example 26 | 0.4489 | 5.0396 | 76.7345 | 16.7730 |
| Example 27 | 0.4196 | 4.9435 | 76.8777 | 16.8587 |
| Example 28 | 0.6230 | 5.5740 | 75.8821 | 16.2606 |
| Example 29 | 0.4573 | 5.0914 | 76.6870 | 16.7396 |
| Example 30 | 0.3728 | 4.7795 | 77.0564 | 17.0414 |
| Example 31 | 0.5553 | 5.3562 | 76.2438 | 16.4735 |
| Example 32 | 0.4721 | 5.1452 | 76.5922 | 16.6644 |
| Example 33 | 0.3541 | 4.6673 | 77.2055 | 17.2300 |
| Example 34 | 0.5807 | 5.4423 | 76.0267 | 16.3543 |
| Example 35 | 0.4340 | 4.9872 | 76.7678 | 16.8095 |
| Example 36 | 0.3594 | 4.7293 | 77.1713 | 17.1743 |

TABLE 10

|  | Contact Resistance (mΩ) | Serial Resistance (mΩ) | Fill Factor | Efficiency (%) |
|---|---|---|---|---|
| Example 37 | 0.5248 | 5.2897 | 76.3857 | 16.5675 |
| Example 38 | 0.4669 | 5.1157 | 76.6437 | 16.7079 |
| Example 39 | 0.4210 | 4.9587 | 76.8712 | 16.8560 |
| Example 40 | 0.5735 | 5.4400 | 76.0593 | 16.3709 |
| Example 41 | 0.5092 | 5.2538 | 76.4700 | 16.6047 |
| Example 42 | 0.3848 | 4.8420 | 76.9169 | 16.9931 |
| Example 43 | 0.5575 | 5.3591 | 76.2423 | 16.4690 |
| Example 44 | 0.4732 | 5.1473 | 76.5724 | 16.6631 |
| Example 45 | 0.3789 | 4.7995 | 76.9979 | 17.0305 |
| Example 46 | 0.5625 | 5.4077 | 76.2015 | 16.4428 |
| Example 47 | 0.4527 | 5.0680 | 76.7186 | 16.7552 |
| Example 48 | 0.4269 | 4.9700 | 76.8402 | 16.8306 |
| Example 49 | 0.5827 | 5.4613 | 76.0001 | 16.3174 |
| Example 50 | 0.4819 | 5.1479 | 76.5636 | 16.6572 |
| Example 51 | 0.3314 | 4.5578 | 77.4322 | 17.4208 |
| Example 52 | 0.5251 | 5.2970 | 76.3638 | 16.5662 |
| Example 53 | 0.5042 | 5.2519 | 76.4803 | 16.6202 |
| Example 54 | 0.3487 | 4.6473 | 77.2971 | 17.2716 |

TABLE 11

|  | Contact Resistance (mΩ) | Serial Resistance (mΩ) | Fill Factor | Efficiency (%) |
|---|---|---|---|---|
| Example 55 | 0.5462 | 5.3318 | 76.2802 | 16.5236 |
| Example 56 | 0.4623 | 5.1106 | 76.6458 | 16.7135 |

TABLE 11-continued

|  | Contact Resistance (mΩ) | Serial Resistance (mΩ) | Fill Factor | Efficiency (%) |
|---|---|---|---|---|
| Example 57 | 0.4131 | 4.9408 | 76.9007 | 16.9030 |
| Example 58 | 0.5807 | 5.4491 | 76.0189 | 16.3462 |
| Example 59 | 0.4509 | 5.0559 | 76.7319 | 16.7554 |
| Example 60 | 0.3553 | 4.6934 | 77.1803 | 17.1995 |
| Example 61 | 0.5496 | 5.3437 | 76.2515 | 16.4867 |
| Example 62 | 0.5154 | 5.2615 | 76.4280 | 16.5969 |
| Example 63 | 0.3792 | 4.8165 | 76.9591 | 17.0149 |
| Example 64 | 0.5456 | 5.3262 | 76.3298 | 16.5288 |
| Example 65 | 0.4924 | 5.1691 | 76.5155 | 16.6514 |
| Example 66 | 0.3728 | 4.7795 | 77.0564 | 17.0414 |
| Example 67 | 0.5280 | 5.3034 | 76.3638 | 16.5595 |
| Example 68 | 0.4527 | 5.0680 | 76.7186 | 16.7552 |
| Example 69 | 0.4258 | 4.9665 | 76.8445 | 16.8313 |
| Example 70 | 0.5997 | 5.5566 | 75.9158 | 16.2762 |
| Example 71 | 0.4602 | 5.1002 | 76.6673 | 16.7265 |
| Example 72 | 0.3962 | 4.8950 | 76.9082 | 16.9523 |

TABLE 12

|  | Contact Resistance (mΩ) | Serial Resistance (mΩ) | Fill Factor | Efficiency (%) |
|---|---|---|---|---|
| Example 73 | 0.5372 | 5.3212 | 76.3419 | 16.5485 |
| Example 74 | 0.4967 | 5.2420 | 76.4962 | 16.6277 |
| Example 75 | 0.3691 | 4.7719 | 77.1099 | 17.0972 |
| Example 76 | 0.5997 | 5.5566 | 75.9158 | 16.2762 |
| Example 77 | 0.4692 | 5.1346 | 76.6011 | 16.6660 |
| Example 78 | 0.4196 | 4.9435 | 76.8777 | 16.8587 |
| Example 79 | 0.5621 | 5.3611 | 76.2374 | 16.4599 |
| Example 80 | 0.4347 | 5.0023 | 76.7667 | 16.8016 |
| Example 81 | 0.3585 | 4.7080 | 77.1725 | 17.1843 |
| Example 82 | 0.5709 | 5.4212 | 76.1051 | 16.4089 |
| Example 83 | 0.5108 | 5.2597 | 76.4349 | 16.6013 |
| Example 84 | 0.3535 | 4.6670 | 77.2094 | 17.2507 |
| Example 85 | 0.5168 | 5.2701 | 76.4095 | 16.5879 |
| Example 86 | 0.4292 | 4.9806 | 76.7776 | 16.8133 |
| Example 87 | 0.3423 | 4.6327 | 77.3431 | 17.3290 |
| Example 88 | 0.5162 | 5.2621 | 76.4216 | 16.5902 |
| Example 89 | 0.4485 | 5.0301 | 76.7583 | 16.7775 |
| Example 90 | 0.3851 | 4.8638 | 76.9134 | 16.9647 |
| Example 91 | 0.5729 | 5.4360 | 76.0623 | 16.3980 |
| Example 92 | 0.4916 | 5.1490 | 76.5434 | 16.6546 |
| Example 93 | 0.3596 | 4.7576 | 77.1590 | 17.1574 |

TABLE 13

|  | Contact Resistance (mΩ) | Serial Resistance (mΩ) | Fill Factor | Efficiency (%) |
|---|---|---|---|---|
| Comparative Example 1 | 0.8900 | 7.7074 | 71.4083 | 15.5281 |
| Comparative Example 2 | 0.9391 | 10.8409 | 70.3959 | 15.0477 |

As shown in Table 8 to 13, it can be seen that the solar cell electrodes fabricated using the compositions prepared using the glass frits that have a mole ratio of Ag:Te ranging from 1:0.1 to 1:25 in Examples 1 to 93 have low contact resistance and serial resistance, thereby providing excellent fill factor and conversion efficiency, as compared with those of Comparative Example 1 in which the mole ratio of Ag:Te was out of the ranges as described herein and Comparative Example 2 in which elemental silver (Ag) was not contained in the glass frits.

It should be understood that various modifications, changes, alterations, and equivalent embodiments can be made by those skilled in the art without departing from the spirit and scope of the invention.

The invention claimed is:

1. A composition for solar cell electrodes, the composition comprising:
   a silver (Ag) powder;
   a glass frit containing elemental silver and elemental tellurium; and
   an organic vehicle,
   wherein the glass frit has a mole ratio of silver to tellurium of 1:0.1 to 1:25, and
   wherein the elemental silver in the glass frit is derived from at least one of silver cyanide, silver nitrate, silver halide, silver carbonate, and silver acetate.

2. The composition according to claim 1, wherein the glass frit further includes at least one of lead (Pb), bismuth (Bi), phosphorus (P), germanium (Ge), gallium (Ga), antimony (Sb), cerium (Ce), iron (Fe), lithium (Li), silicon (Si), zinc (Zn), tungsten (W), magnesium (Mg), cesium (Cs), strontium (Sr), molybdenum (Mo), titanium (Ti), tin (Sn), indium (In), vanadium (V), ruthenium (Ru), barium (Ba), nickel (Ni), copper (Cu), sodium (Na), potassium (K), arsenic (As), cobalt (Co), zirconium (Zr), manganese (Mn), neodymium (Nd), chromium (Cr), and aluminum (Al).

3. The composition according to claim 1, wherein the glass frit is formed from a metal oxide and the at least one of silver cyanide, silver nitrate, silver halide, silver carbonate, and silver acetate, the metal oxide including tellurium oxide.

4. The composition according to claim 3, wherein the metal oxide further includes at least one of lead (Pb) oxide, bismuth (Bi) oxide, phosphorus (P) oxide, germanium (Ge) oxide, gallium (Ga) oxide, antimony (Sb) oxide, cerium (Ce) oxide, iron (Fe) oxide, lithium (Li) oxide, silicon (Si) oxide, zinc (Zn) oxide, tungsten (W) oxide, magnesium (Mg) oxide, cesium (Cs) oxide, strontium (Sr) oxide, molybdenum (Mo) oxide, titanium (Ti) oxide, tin (Sn) oxide, indium (In) oxide, vanadium (V) oxide, ruthenium (Ru) oxide, barium (Ba) oxide, nickel (Ni) oxide, copper (Cu) oxide, sodium (Na) oxide, potassium (K) oxide, arsenic (As) oxide, cobalt (Co) oxide, zirconium (Zr) oxide, manganese (Mn) oxide, neodymium (Nd) oxide, chromium (Cr) oxide, and aluminum (Al) oxide.

5. The composition according to claim 1, wherein the composition includes:
   60 wt % to 95 wt % of the silver powder;
   0.1 wt % to 20 wt % of the glass fit; and
   1 wt % to 30 wt % of the organic vehicle, all wt % based on a total weight of the composition.

6. The composition according to claim 1, wherein the glass frit contains 0.1 mol % to 50 mol % of the elemental silver, based on a total number of moles of the glass frit.

7. The composition according to claim 1, wherein the glass frit has an average particle diameter (D50) of 0.1 μm to 10 μm.

8. The composition according to claim 1, further comprising: at least one of a dispersant, a thixotropic agent, a plasticizer, a viscosity stabilizer, an anti-foaming agent, a pigment, a UV stabilizer, an antioxidant, and a coupling agent.

9. A solar cell electrode prepared from the composition for solar cell electrodes according to claim 1.

* * * * *